United States Patent
Manohar et al.

(10) Patent No.: US 9,183,081 B2
(45) Date of Patent: Nov. 10, 2015

(54) SYSTEMS AND METHODS FOR PERFORMING DEFECT DETECTION AND DATA RECOVERY IN A MEMORY SYSTEM

(71) Applicants: Abhijeet Manohar, San Jose, CA (US); Chris Avila, Saratoga, CA (US); Jianmin Huang, San Carlos, CA (US); Daniel Edward Tuers, Kapaa, HI (US)

(72) Inventors: Abhijeet Manohar, San Jose, CA (US); Chris Avila, Saratoga, CA (US); Jianmin Huang, San Carlos, CA (US); Daniel Edward Tuers, Kapaa, HI (US)

(73) Assignee: SanDisk Technologies Inc., Plano, TX (US)

( * ) Notice: Subject to any disclaimer, the term of this patent is extended or adjusted under 35 U.S.C. 154(b) by 108 days.

(21) Appl. No.: 13/795,460

(22) Filed: Mar. 12, 2013

(65) Prior Publication Data

US 2014/0281682 A1    Sep. 18, 2014

(51) Int. Cl.

| G06F 11/00 | (2006.01) |
|---|---|
| G06F 11/10 | (2006.01) |
| G11C 29/52 | (2006.01) |
| G11C 29/04 | (2006.01) |

(52) U.S. Cl.
CPC ............ *G06F 11/1044* (2013.01); *G11C 29/52* (2013.01); *G11C 2029/0401* (2013.01); *G11C 2029/0409* (2013.01); *G11C 2029/0411* (2013.01)

(58) Field of Classification Search
USPC .................................................. 714/6.1, 6.11
See application file for complete search history.

(56) References Cited

U.S. PATENT DOCUMENTS

| 6,044,441 | A | * | 3/2000 | Malinowski .................. 711/144 |
|---|---|---|---|---|
| 6,076,129 | A | * | 6/2000 | Fenwick et al. .............. 710/305 |
| 6,757,840 | B1 | | 6/2004 | Pawlowski |
| 2007/0174718 | A1 | | 7/2007 | Fouquet-Lapar |
| 2008/0189582 | A1 | | 8/2008 | Ho et al. |
| 2009/0228634 | A1 | * | 9/2009 | Nakamura et al. ............ 711/103 |
| 2010/0318839 | A1 | * | 12/2010 | Avila et al. ........................ 714/5 |
| 2011/0096930 | A1 | * | 4/2011 | Walmsley ..................... 380/278 |
| 2012/0297244 | A1 | * | 11/2012 | Kitahara et al. ............. 714/6.22 |
| 2012/0311388 | A1 | * | 12/2012 | Cronin et al. ................... 714/42 |
| 2013/0173967 | A1 | * | 7/2013 | Comparan et al. .............. 714/42 |
| 2014/0012940 | A1 | * | 1/2014 | Joshi et al. .................... 709/214 |
| 2014/0068149 | A1 | * | 3/2014 | Kanamori et al. ............ 711/103 |

FOREIGN PATENT DOCUMENTS

EP    2 026 355    2/2009

* cited by examiner

*Primary Examiner* — Sarai Butler
(74) *Attorney, Agent, or Firm* — Brinks Gilson & Lione

(57) ABSTRACT

Systems and methods for performing defect detection and data recovery within a memory system are disclosed. A controller of a memory system may receive a command to write data in a memory of the memory system; determine a physical location of the memory that is associated with the data write; write data associated with the data write to the physical location; and store the physical location of the memory that is associated with the data write in a Tag cache. The controller may further identify a data keep cache of a plurality of data keep caches that is associated with the data write based on the physical location of the memory that is associated with the data write; update an XOR sum based on the data of the data write; and store the updated XOR sum in the identified data keep cache.

15 Claims, 9 Drawing Sheets

SYSTEMS AND METHODS FOR PERFORMING DEFECT DETECTION AND DATA RECOVERY IN A MEMORY SYSTEM

RELATED APPLICATIONS

The present application is related to U.S. patent application Ser. No. 13/795,470, filed Mar. 12, 2013, and titled "Systems and Methods for Performing Data Recovery in Memory System," the entirety of which is hereby incorporated by reference.

BACKGROUND

Traditionally, manufacturers test memory within memory systems at the time of manufacture in order to detect defects within the memory. One way in which manufacturers test memory for defects is to subject the memory to a number of operations in order to bring out defects in the memory. For example, causing significant stress in a memory may result in errors becoming evident such as a strong or weak control gate substrate short ("CGSS"), a wordline-to-wordline short, and/or a broken wordline within the memory of the storage system.

While the above-described procedure may allow manufacturers to detect defects within the memory, applying enough stress to the memory in order to bring out the defects may cause the memory to become vulnerable to more failures causing a loss of memory yield. Therefore, improved systems and methods for detecting defects within a memory that do not reduce an overall memory yield are desirable.

SUMMARY

The present disclosure is directed to systems and methods for performing defect detection and data recovery in a memory system. In one aspect, a method for performing defect detection and data recovery is disclosed. The elements of the method occur in a controller of a storage device coupled to a host device. The controller receives a command to write data in a memory of the storage device and determines a physical location of the memory that is associated with the data write. The controller writes data associated with the data write to the physical location of the memory and stores the physical location of the memory that is associated with the data write in a Flash Management Unit Tag cache ("Tag cache").

The controller additionally identifies a data keep cache of a plurality of data keep caches that is associated with the data write based on the physical location of the memory that is associated with the data write; updates an XOR sum stored in the identified data keep cache based on the data of the data write and the XOR sum that is stored in the identified data keep cache; and stores the second XOR sum in the identified data keep cache.

In another aspect, a memory system including a non-volatile memory and a processor in communication with the non-volatile memory is disclosed. The processor is configured to perform defect detection and data recovery within the memory system. The processor is further configured to receive a command to write data in the non-volatile memory; determine a physical location of the non-volatile memory that is associated with the data write; write data associated with the data write to the physical location of the non-volatile memory; and store the physical location of the non-volatile memory that is associated with the data write in a Flash Management Unit Tag cache ("Tag cache").

The processor is additionally configured to identify a data keep cache of a plurality of data keep caches that is associated with the data write based on the physical location of the non-volatile memory that is associated with the data write; update an XOR sum stored in the identified data keep cache based on the data of the data write and the XOR sum that is stored in the identified data keep cache; and store the second XOR sum in the identified data keep cache.

DETAILED DESCRIPTION OF THE DRAWINGS

The present disclosure is directed to systems and methods for performing defect detection and data recovery in a memory system. As explained in more detail below, a controller may utilize a system cache, such as a Flash Management Unit Tag cache ("Tag cache"), and a plurality of data keep caches to store information as the controller performs data write operations. When an error is detected, the controller may reconstruct and restore data to the physical location of the memory associated with the error. Additionally, the controller may test other physical locations of the memory for potential errors based on the physical location of the memory where the detected error occurred. Because the memory system utilizes techniques that are able to detect defects in a memory and perform error correction at a system level, manufactures may refrain from performing harsh testing on the memory system that may reduce the overall yield of the memory.

Figure 1:
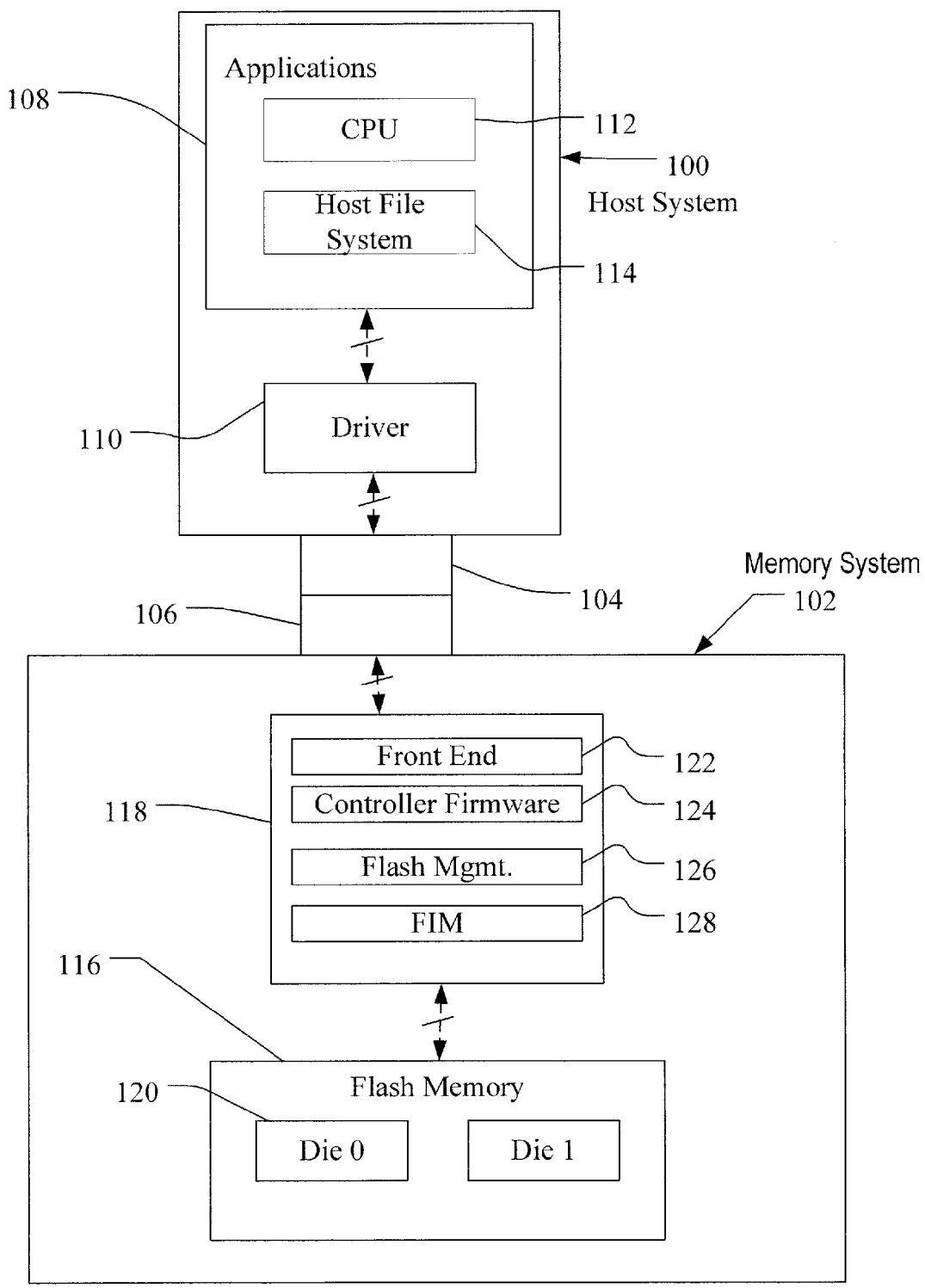
FIG. 1 illustrates a host connected with a memory system having a multi-bank non-volatile memory containing multiple die that may implement the disclosed methods for performing defect detection and data recovery.

A flash memory system suitable for use in implementing aspects of the invention is shown in FIGS. 1-6. A host system 100 of FIG. 1 stores data into and retrieves data from a memory system 102. The memory system may be flash memory embedded within the host, such as in the form of a solid state disk (SSD) drive installed in a personal computer. Alternatively, the memory system 102 may be in the form of a card that is removably connected to the host through mating parts 104 and 106 of a mechanical and electrical connector as illustrated in FIG. 1. A flash memory configured for use as an internal or embedded SSD drive may look similar to the schematic of FIG. 1, with the primary difference being the location of the memory system 102 internal to the host. SSD drives may be in the form of discrete modules that are drop-in replacements for rotating magnetic disk drives.

The host system 100 of FIG. 1 may be viewed as having two major parts, in so far as the memory system 102 is concerned, made up of a combination of circuitry and software. They are an applications portion 108 and a driver portion 110 that interface with the memory system 102. In a PC, for example, the applications portion 108 can include a processor 112 running word processing, graphics, control or other popular application software, as well as the file system 114 for managing data on the host 100. In a camera, cellular telephone or other host system that is primarily dedicated to perform a single set of functions, the applications portion 108 includes the software that operates the camera to take and store pictures, the cellular telephone to make and receive calls, and the like.

The memory system 102 of FIG. 1 may include non-volatile memory, such as flash memory 116; a system controller 118 that both interfaces with the host 100 to which the memory system 102 is connected for passing data back and forth and controls the memory 116; and one or more data buffers 119 coupled with the system controller 118 that the system controller 118 utilizes to buffer data before storing the data to the flash memory 116. The system controller 118 may convert between logical addresses of data used by the host 100 and physical addresses of the flash memory 116 during data programming and reading. The flash memory 116 may include any number of memory die 120 and two memory die are shown in FIG. 1 simply by way of illustration.

Functionally, the system controller 118 may include a front end 122 that interfaces with the host system, controller logic 124 for coordinating operation of the memory 116, flash management logic 126 for internal memory management operations such as garbage collection, and one or more flash interface modules (FIMs) 128 to provide a communication interface between the controller with the flash memory 116.

Figure 2:
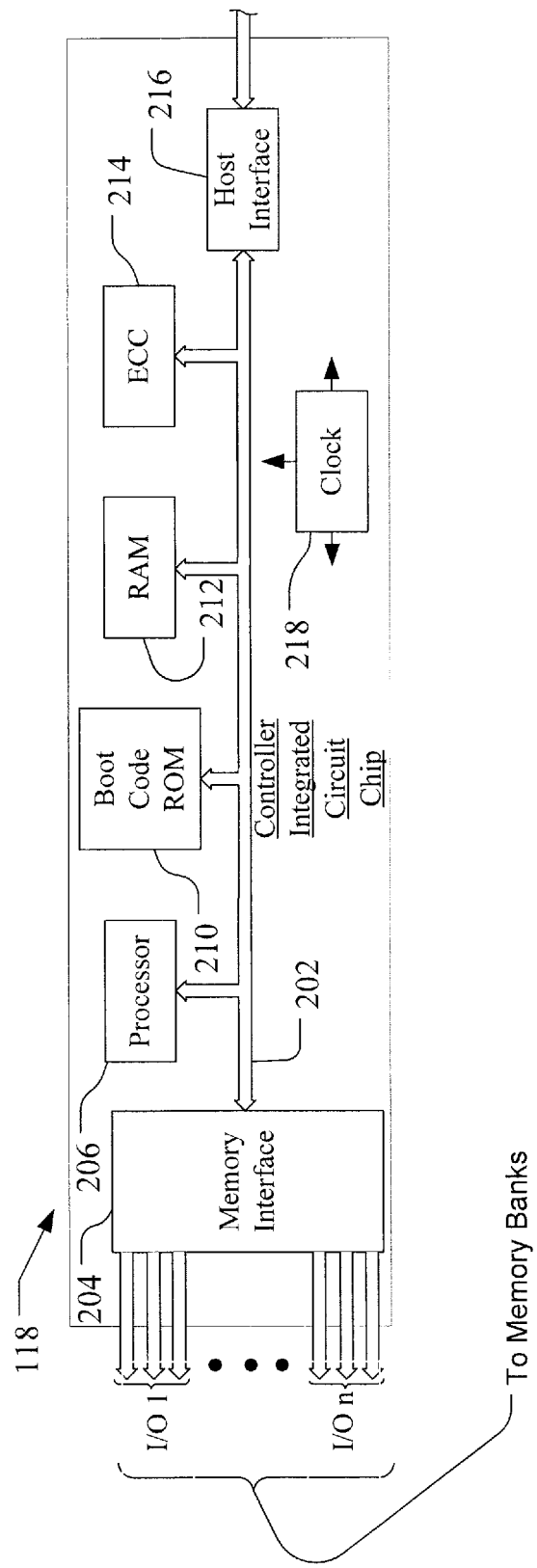
FIG. 2 is an example block diagram of an example flash memory system controller for use in the multiple die non-volatile memory of FIG. 1.

The system controller 118 may be implemented on a single integrated circuit chip, such as an application specific integrated circuit (ASIC) such as shown in FIG. 2. The processor 206 of the system controller 118 may be configured as a multi-thread processor capable of communicating separately with each of the respective memory banks 120 via a memory interface 204 having I/O ports for each of the respective banks 120 in the flash memory 116. The system controller 118 may include an internal clock 218. The processor 206 communicates with an error correction code (ECC) module 214, a RAM buffer 212, a host interface 216, and boot code ROM 210 via an internal data bus 202.

Figure 3:
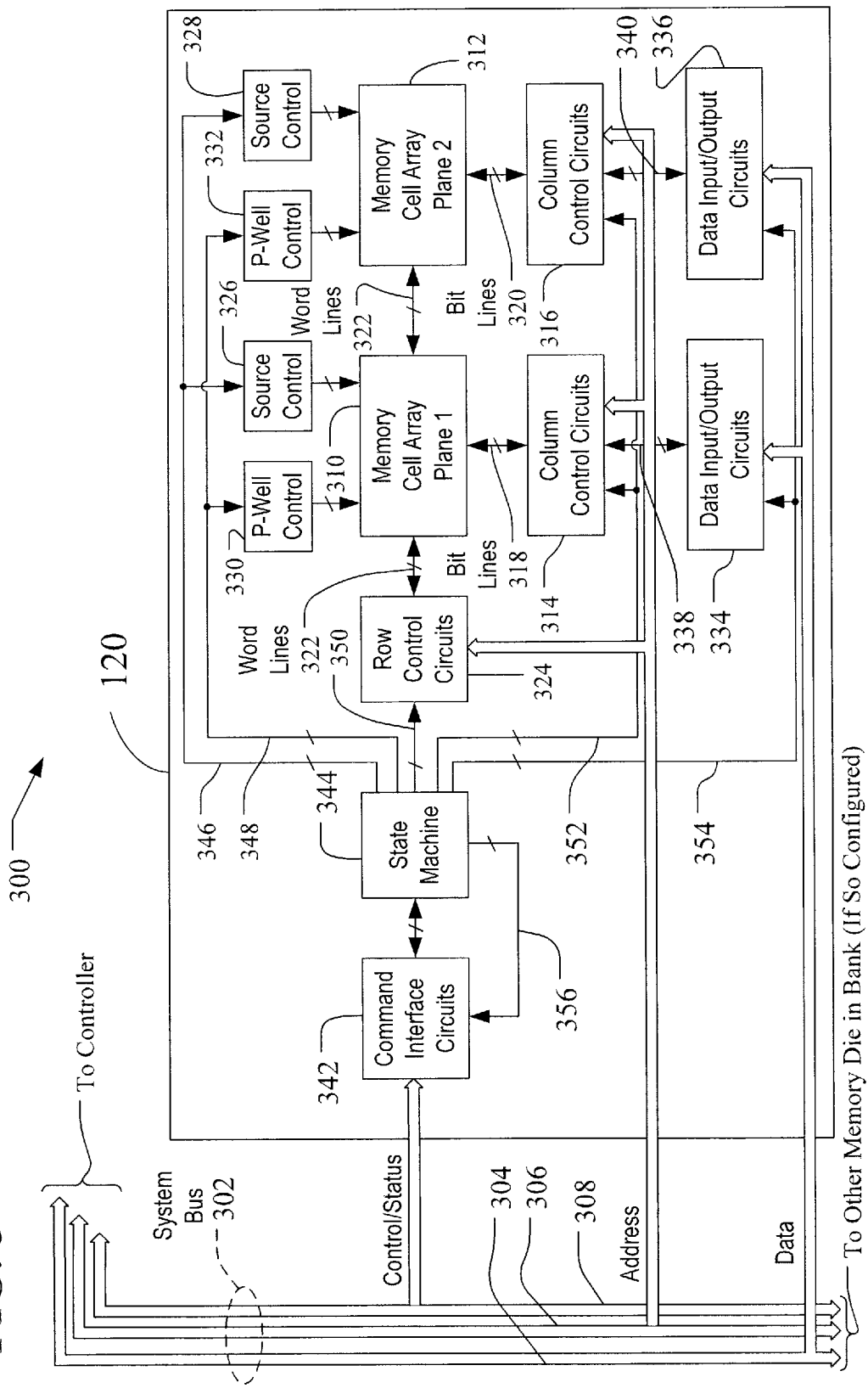
FIG. 3 is an example one flash memory bank suitable as one of the non-volatile memory banks illustrated in FIG. 1.

Each die 120 in the flash memory 116 may contain an array of memory cells organized into multiple planes. FIG. 3 shows such planes 310 and 312 for simplicity but a greater number of planes, such as four or eight planes, may instead be used. Alternatively, the memory cell array of a memory bank may not be divided into planes. When so divided, however, each plane has its own column control circuits 314 and 316 that are operable independently of each other. The circuits 314 and 316 receive addresses of their respective memory cell array from the address portion 306 of the system bus 302, and decode them to address a specific one or more of respective bit lines 318 and 320. The word lines 322 are addressed through row control circuits 324 in response to addresses received on the address bus 306. Source voltage control circuits 326 and 328 are also connected with the respective planes, as are p-well voltage control circuits 330 and 332. If the bank 300 is in the form of a memory chip with a single array of memory cells, and if two or more such chips exist in the system, data are transferred into and out of the planes 310 and 312 through respective data input/output circuits 334 and 336 that are connected with the data portion 304 of the system bus 302. The circuits 334 and 336 provide for both programming data into the memory cells and for reading data from the memory cells of their respective planes, through lines 338 and 340 connected to the planes through respective column control circuits 314 and 316.

Although the processor 206 in the system controller 118 controls the operation of the memory chips in each bank 120 to program data, read data, erase and attend to various housekeeping matters, each memory chip also contains some controlling circuitry that executes commands from the controller 118 to perform such functions. Interface circuits 342 are connected to the control and status portion 308 of the system bus 302. Commands from the controller 118 are provided to a state machine 344 that then provides specific control of other circuits in order to execute these commands. Control lines 346-354 connect the state machine 344 with these other circuits as shown in FIG. 3. Status information from the state machine 344 is communicated over lines 356 to the interface 342 for transmission to the controller 118 over the bus portion 308.

A NAND architecture of the memory cell arrays 310 and 312 is discussed below, although other architectures, such as NOR, can be used instead. An example NAND array is illustrated by the circuit diagram of FIG. 4, which is a portion of the memory cell array 310 of the memory bank 300 of FIG. 3. A large number of global bit lines are provided, only four such lines 402-408 being shown in FIG. 4a for simplicity of explanation. A number of series connected memory cell strings 410-424 are connected between one of these bit lines and a reference potential. Using the memory cell string 414 as representative, a plurality of charge storage memory cells 426-432 are connected in series with select transistors 434 and 436 at either end of the string. When the select transistors of a string are rendered conductive, the string is connected between its bit line and the reference potential. One memory cell within that string is then programmed or read at a time.

Figure 4A:
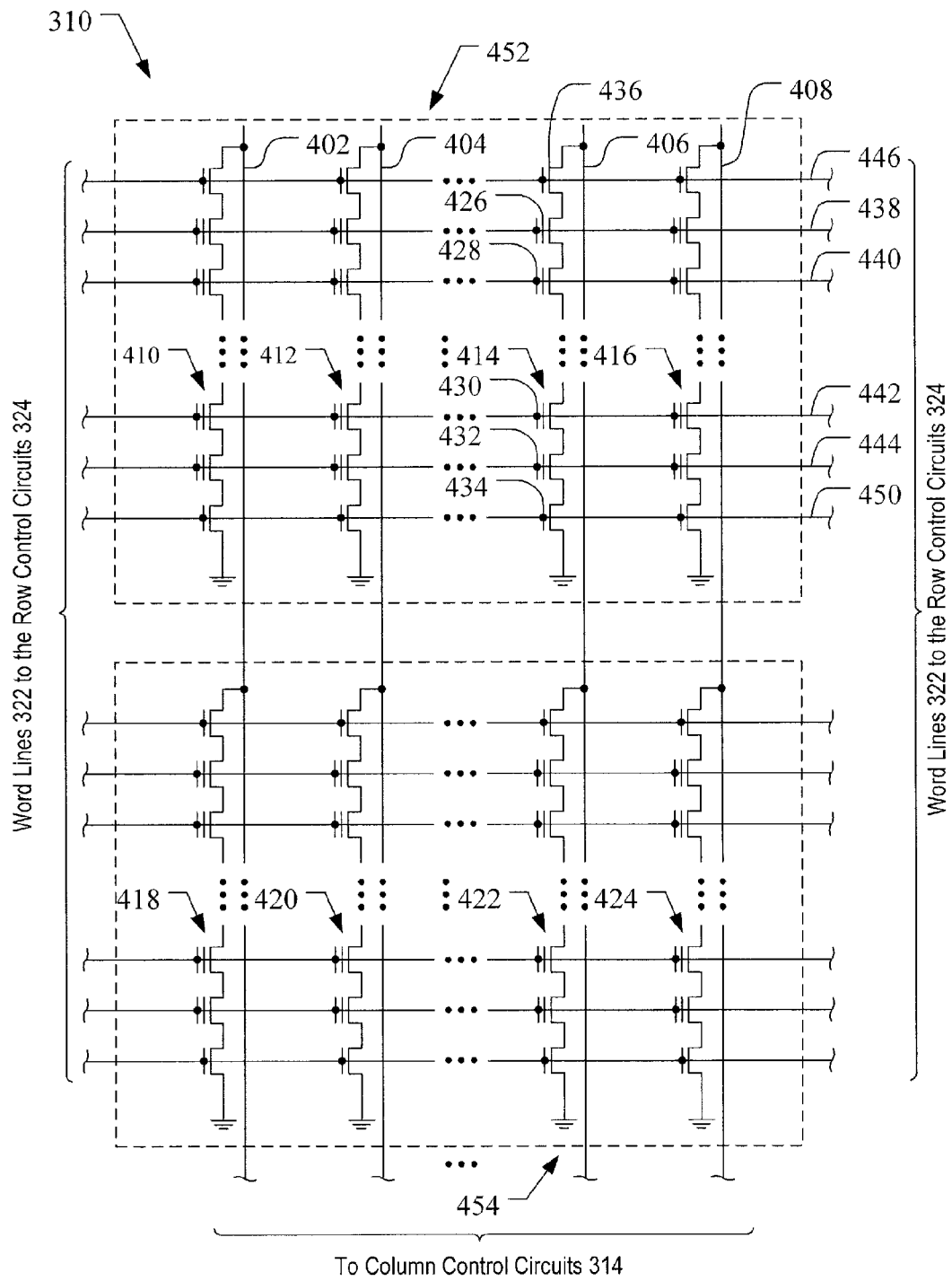
FIG. 4a is a representative circuit diagram of a memory cell array that may be used in the memory bank of FIG. 3.

Word lines 438-444 of FIG. 4a individually extend across the charge storage element of one memory cell in each of a number of strings of memory cells, and gates 446 and 450 control the states of the select transistors at each end of the strings. The memory cell strings that share common word and control gate lines 438-450 are made to form a block 452 of memory cells that are erased together. This block of cells contains the minimum number of cells that are physically erasable at one time. One row of memory cells, those along one of the word lines 438-444, are programmed at a time. Typically, the rows of a NAND array are programmed in a prescribed order, in this case beginning with the row along the word line 444 closest to the end of the strings connected to ground or another common potential. The row of memory cells along the word line 442 is programmed next, and so on, throughout the block 452. However, in other implementations, the rows of a NAND array are not programmed in sequential order.

A second block 454 is similar, its strings of memory cells being connected to the same global bit lines as the strings in the first block 452 but having a different set of word and control gate lines. The word and control gate lines are driven to their proper operating voltages by the row control circuits 324. If there is more than one plane in the system, such as planes 1 and 2 of FIG. 3, one memory architecture uses common word lines extending between them. There can alternatively be more than two planes that share common word lines. In other memory architectures, the word lines of individual planes are separately driven.

The memory cells may be operated to store two levels of charge so that a single bit of data is stored in each cell. This is typically referred to as a binary or single level cell (SLC) memory. Alternatively, the memory cells may be operated to store more than two detectable levels of charge in each charge storage element or region, thereby to store more than one bit of data in each. This latter configuration is referred to as multi level cell (MLC) memory. Both types of memory cells may be used in a memory. For example, binary flash memory may be used for caching data and MLC memory may be used for longer term storage. The charge storage elements of the memory cells are most commonly conductive floating gates but may alternatively be non-conductive dielectric charge trapping material.

In implementations of MLC memory operated to store two bits of data in each memory cell, each memory cell is configured to store four levels of charge corresponding to values of "11," "01," "10," and "00." Each bit of the two bits of data may represent a page bit of a lower page or a page bit of an upper page, where the lower page and upper page span across a series of memory cells sharing a common word line. Typically, the less significant bit of the two bits of data represents a page bit of a lower page and the more significant bit of the two bits of data represents a page bit of an upper page.

Figure 4B:
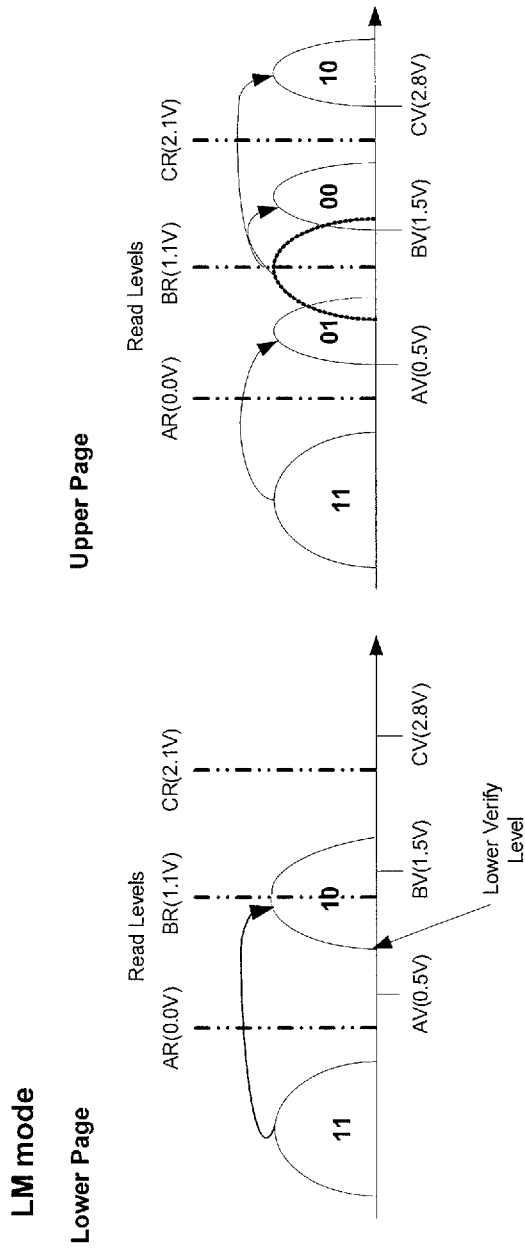
FIG. 4b illustrates charge levels in a MLC memory operated to store two bits of data in a memory cell.

FIG. 4b illustrates one implementation of the four charge levels used to represent two bits of data in a memory cell. A value of "11" corresponds to an un-programmed state of the memory cell. When programming pulses are applied to the memory cell to program a page bit of the lower page, the level of charge is increased to represent a value of "10" corresponding to a programmed state of the page bit of the lower page.

For a page bit of an upper page, when the page bit of the lower page is programmed (a value of "10"), programming pulses are applied to the memory cell for the page bit of the upper page to increase the level of charge to correspond to a value of "00" or "10" depending on the desired value of the page bit of the upper page. However, if the page bit of the lower page is not programmed such that the memory cell is in an un-programmed state (a value of "11"), applying programming pulses to the memory cell to program the page bit of the upper page increases the level of charge to represent a value of "01" corresponding to a programmed state of the page bit of the upper page.

Figure 5:
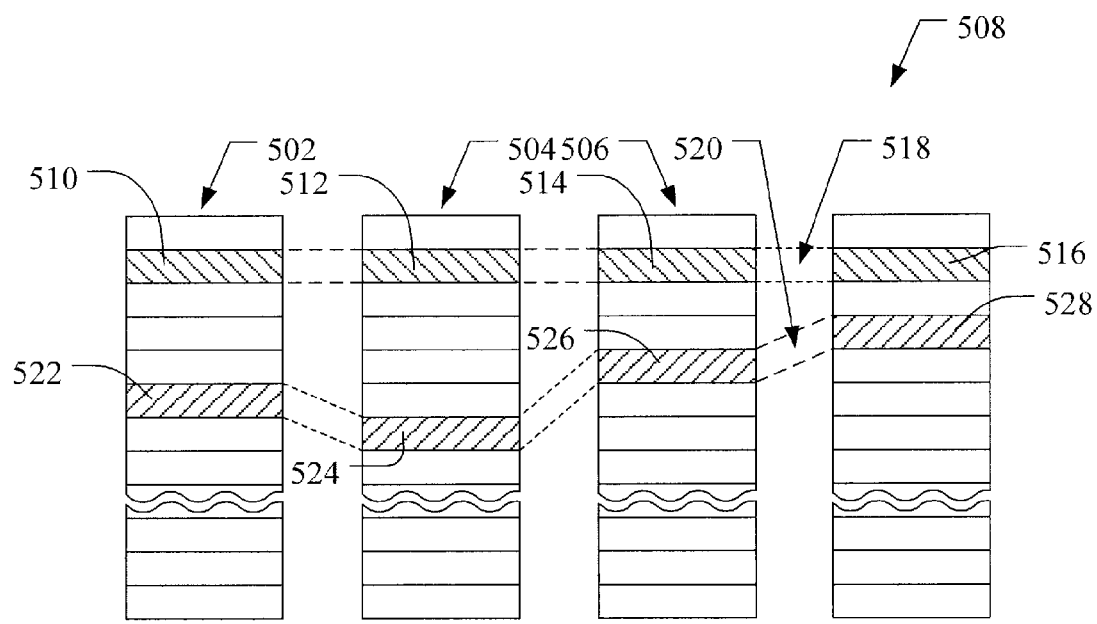
FIG. 5 illustrates an example physical memory organization of the memory bank of FIG. 3.

FIG. 5 conceptually illustrates a multiple plane arrangement showing four planes 502-508 of memory cells. These planes 502-508 may be on a single die, on two die (two of the planes on each die) or on four separate die. Of course, other numbers of planes, such as 1, 2, 8, 16 or more may exist in each die of a system. The planes are individually divided into blocks of memory cells shown in FIG. 5 by rectangles, such as blocks 510, 512, 514 and 516, located in respective planes 502-508. There can be dozens or hundreds of blocks in each plane.

As mentioned above, a block of memory cells is the unit of erase, the smallest number of memory cells that are physically erasable together. For increased parallelism, however, the blocks are operated in larger metablock units. One block from each plane is logically linked together to form a metablock. The four blocks 510-516 are shown to form one metablock 518. All of the cells within a metablock are typically erased together. The blocks used to form a metablock need not be restricted to the same relative locations within their respective planes, as is shown in a second metablock 520 made up of blocks 522-528. Although it is usually preferable to extend the metablocks across all of the planes, for high system performance, the memory system can be operated with the ability to dynamically form metablocks of any or all of one, two or three blocks in different planes. This allows the size of the metablock to be more closely matched with the amount of data available for storage in one programming operation.

Figure 6:
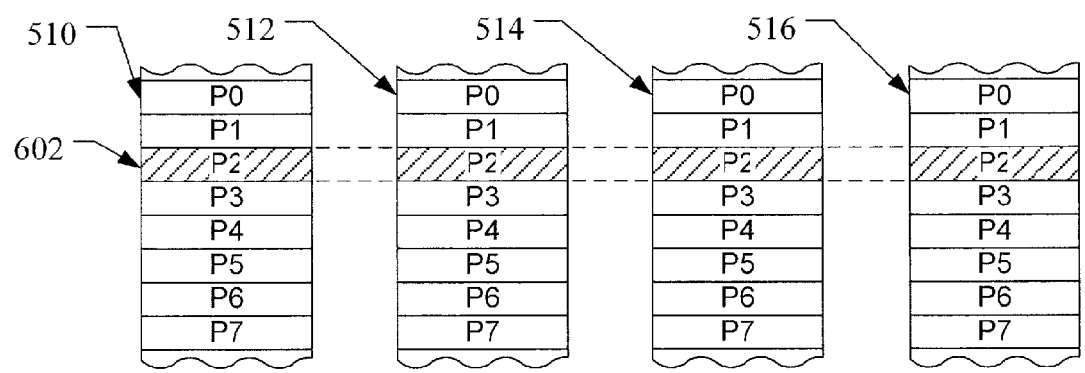
FIG. 6 shows an expanded view of a portion of the physical memory of FIG. 5.

The individual blocks are in turn divided for operational purposes into pages of memory cells, as illustrated in FIG. 6. The memory cells of each of the blocks 510-516, for example, are each divided into eight pages P0-P7. Alternatively, there may be 32, 64 or more pages of memory cells within each block. The page is the unit of data programming and reading within a block, containing the minimum amount of data that are programmed or read at one time. In the NAND architecture of FIG. 3, a page is formed of memory cells along a word line within a block. However, in order to increase the memory system operational parallelism, such pages within two or more blocks may be logically linked into metapages. A metapage 602 is illustrated in FIG. 6, being formed of one physical page from each of the four blocks 510-516. The metapage 602, for example, includes the page P2 in each of the four blocks but the pages of a metapage need not necessarily have the same relative position within each of the blocks.

The flash management layer in the controller firmware of the memory card may choose to allocate memory in terms of allocation units called logical groups. Writes that are less than a logical group size will result in the controller copying valid data stored at an original physical location to a new physical location in addition to the controller writing incoming data. This overhead decreases performance and endurance of the memory. In order to minimize this overhead, a group of memory is used as update blocks. An update block is usually a memory of better endurance than the data blocks. i.e, if the data blocks have MLC memory, the update blocks have SLC memory. Writes that are less than a logical group may result in the controller directing data into the update blocks, and after consolidation, the controller may copy data at a later point in time from the update block to one or more program data blocks. The controller performs these actions based on the fact that the update blocks are more durable and there is more possibility of collecting the entire logical group of data in the update blocks before writing into the data blocks, thus reducing overhead in the MLC memory. It is also more desirable to retain frequently written data blocks in the update block for similar reasons.

As mentioned above, this disclosed systems and methods provide for a controller of a memory system that performs defect detection and data recovery at a system level. Generally, as the controller performs data writes to a non-volatile memory of the memory system, the controller records a physical location associated with the data writes in a Flash Management Unit Tag cache ("Tag cache"), which is typically part of the controller RAM. In some implementations, the size of the Tag cache is static. In other implementations, a controller may dynamically adjust a size of the Tag cache based on a number of open data blocks in the memory system.

Based on the physical location associated with the data writes, the controller also assigns the data write to one of a plurality of data keep caches. The controller further updates an XOR sum stored in the identified data keep cache based on the data of the data write. The data keep caches are typically part of the controller RAM. In some implementations, the sizes of the data keep caches are static. In other implementations, a controller may dynamically adjust a size of one or more of the data keep caches based on a number of open data blocks in the memory system.

As will be discussed in more detail below, the controller maintains multiple XOR sums, each of which is stored in a different data keep cache and is associated with a different group of physical locations of the memory. The groups of physical locations of the memory associated with the multiple data keep caches are organized such that if one XOR sum is utilized to recalculate data for a first physical location of the memory, at least one of the other XOR sums may be utilized to recalculate and/or verify data for a second physical location of the memory that may have been disturbed by an error at the first physical location of the memory.

In some implementations, the memory system may include a first data keep cache associated with upper pages and even numbered word lines of a die of the memory system; a second data keep cache associated with upper pages and odd numbered word lines of the die of the memory system; a third data keep cache associated with lower pages and even numbered word lines of the die of the memory system; and a fourth data keep cache associated with lower pages and odd numbered word lines of the die of the memory system. However, in other implementations, the memory system may include other than four data keep caches.

Continuing with the example above, due to this organization, if a controller detects a failure such as an erratic program detection failure ("EPD failure) at a physical location of the memory associated with an upper page and an even numbered word line, the controller may utilize the Tag cache and the XOR sum of the first data keep to restore the data to the physical location where the failure was detected. Additionally, the controller may utilize the Tag cache and the XOR sum of the second data keep cache to verify physical locations of the memory associated with upper pages and odd numbered word lines that may have been disturbed by the originally-detected failure. The controller may further utilize the Tag cache and the XOR sum of the third data keep cache to verify physical locations of the memory associated with lower pages and even numbered word lines that may have been disturbed by the originally-detected failure, and the controller may utilize the Tag cache and the XOR sum of the fourth data keep cache to verify physical locations of the memory associated with lower pages and odd numbered word lines that may have been disturbed by the originally-detected failure.

Figure 7:
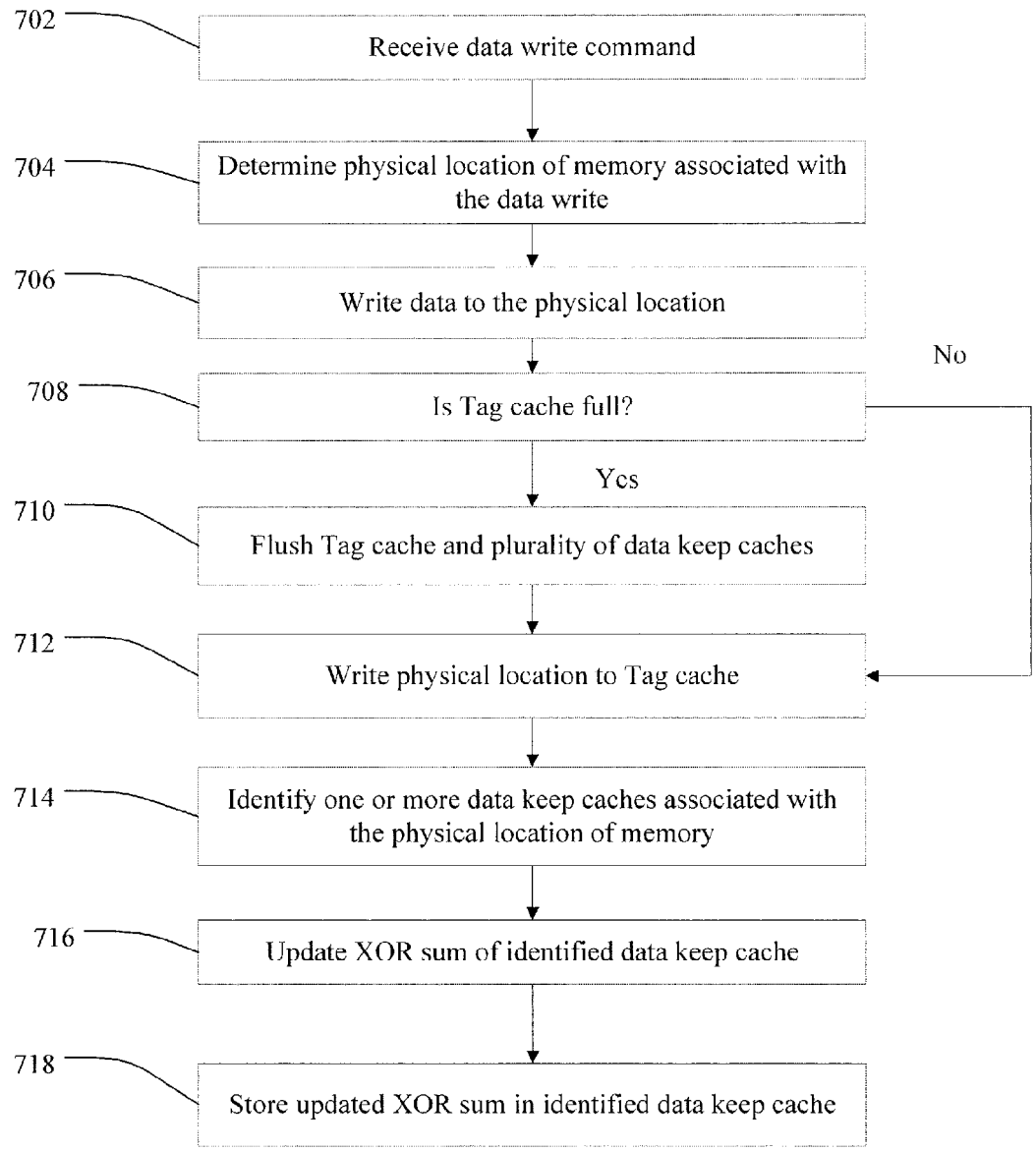
FIG. 7 is a flow chart of one method for processing data writes and storing information associated with data writes in a Tag cache and a plurality of data keep caches.

FIG. 7 is a flow chart of one method for processing data writes and storing information associated with data writes in a Tag cache and a plurality of data keep caches. In some implementations, the elements of the method described in FIG. 7 occur in a controller of a memory system that is coupled to a host device. However, in other implementations, the controller is located on the host device or the controller is divided between the memory system and the host device.

The method begins at step 702 with a controller receiving a command to write data in a non-volatile memory, such as flash memory, of the memory system. It will be appreciated that the controller may receive the command to write data to the memory from the host system or the controller may initiate the command to write data to the memory on its own.

At step 704, the controller determines a physical location of the memory that is associated with the data write. In some implementations, when the controller determines the physical location of the memory associated with the data write, the controller determines a die of the memory, a plane of the die, an upper or lower page, and/or a word line associated with the data write.

At step 706, the controller writes data associated with the data write to the physical location of the memory that the controller previously determined is associated with the data write.

As noted above, the controller utilizes the Tag cache to store physical locations of the memory that are associated with data writes. In implementations where the Tag cache is a normal cache, the controller may check to determine if the Tag cache is full at step 708 before storing the physical location associated with the data write to the Tag cache.

If the controller determines at step 708 that the Tag cache is not full, the controller proceeds to store the physical location associated with the data write in the Tag cache at step 712.

However, if the controller determines at step 708 that the Tag cache is full, the controller flushes the Tag cache and the plurality of data keep caches at step 710 in order to empty the Tag cache and zero out the XOR sums stored in the data keep caches. One process for flushing the Tag cache and the plurality of data keep caches is explained in more detail below in conjunction with FIG. 9. After the controller flushes the Tag cache and the plurality of data keep caches, at step 712, the controller stores the physical location associated with the data write in the Tag cache.

In other implementations, rather than using a normal cache for the Tag cache, the memory system may utilize a first-in-first-out data cache ("FIFO data cache") for the Tag cache. In implementations where a FIFO data cache is utilized for the Tag cache, the controller does not need to check whether the Tag cache is full at step 708 before writing the physical location associated with the data write in the Tag cache at step 712. In instances where the Tag cache is full, when the controller writes the physical location associated with the data write in the Tag cache, the oldest entry is removed from the FIFO data cache. Additionally, the data associated with the data write of the oldest entry is removed from the XOR sum of the data keep cache associated with the physical location of the memory associated with the data write of the oldest entry.

In some implementations utilizing a FIFO data cache for the Tag cache, the controller utilizes double an amount of data keep caches as discussed in the implementations above where the Tag cache is not a FIFO data cache. In these implementations, the data keep caches may include a first set of data keep caches and a corresponding second set of data keep caches.

Both the first and second sets of data keep caches are organized in the same manner such that a data keep cache of the first set of data keep caches and a corresponding data keep cache of the second set of data keep caches are generally associated with the same physical locations of the memory. For example, both data keep caches may be associated with data writes to upper pages and even numbered word lines of the memory; both data keep caches may be associated with data writes to lower pages and even numbered word lines of the memory; both data keep caches may be associated with data writes to upper pages and odd numbered word lines of the memory; or both data keep caches may be associated with data writes to lower pages and odd numbered word lines of the memory.

However, the first set of data keep caches store XOR sums directed to a first portion of physical locations of the memory stored in the Tag cache and the second set of data keep caches store XOR sums directed to a second portion of physical locations of the memory stored in the Tag cache, where the first and second portions of the Tag cache overlap in order to protect vulnerable pages of memory.

For example, if a FIFO Tag cache stores 25 physical locations of memory associated with data writes, the first set of data keep caches may store XOR sums for ten entries and may initially store XOR sums for entries 1-10 of the FIFO Tag cache, and the second set of data keep caches may store XOR sums for ten entries and may initially store XOR sums for entries 6-15 of the FIFO Tag cache. After the controller stores ten entries in the FIFO Tag cache, the controller may zero out the first set of data keep caches and remove the first five entries from the FIFO tag cache. Due to the overlap between the first and second set of data keep caches, if an error occurs at a physical location stored in entries 6-10 of the FIFO Tag cache, the controller may utilize the second set of data keep caches to restore the data since the first set of data keep caches have been zeroed.

As the controller continues to write physical locations of memory to the FIFO Tag cache, the first set of data keep caches may store XOR sums for the next 10 entries of the FIFO Tag cache, entries 11-20 of the FIFO Tag cache in the example above. Once the controller stores data to the fifteenth entry of the FIFO Tag cache, the controller may zero out the second set of data keep caches and remove entries 6-10 from the FIFO Tag cache. Due to the overlap between the first and second set of data keep caches, if an error occurs at a physical location stored in entries 11-15 of the FIFO tag cache, the controller may utilize the first set of data keep caches to restore the data since the second set of data keep caches have been zeroed. It will be appreciated that this process may then continue with the second set of data keep caches storing XOR sums for the next 10 entries of the FIFO Tag cache, entries 16-25 of the FIFO Tag cache in the example above.

In the illustrative example above, the FIFO Tag cache stores 25 entries and the first and second set of data keep caches store XOR sums relating to 10 entries of the FIFO Tag cache. However, it will be appreciated that the FIFO tag cache may be designed to store any number of entries and that the first and second data keep caches may be designed to relate to any number of entries of the FIFO Tag cache so long as when the controller zeroes one of the first and the second set of data keep caches, the overlap between the two sets of data keep caches is significant enough that the other set of data keep caches stores XOR sums that protect any vulnerable physical locations of the memory.

At step 714, the controller identifies a data keep cache of a plurality of data keep caches that is associated with the data write based on the physical location of the memory that is associated with the data write. In some implementations, the controller may identify a data keep cache associated with the data write based on a word line and upper or lower page associated with the physical location that is associated with the data write, as described above.

At step 716, the controller updates an XOR sum stored in the identified data keep cache based on the data of the data write and the XOR sum that is stored in the identified data keep cache. At step 718, the controller stores the updated XOR sum in the identified data keep cache.

It will be appreciated that as the controller continues to execute data write commands, the above-described procedure is repeated for each data write. After executing one of the data writes, the controller may identify a failure at a physical location associated with the data write. For example, the controller may detect an EPD failure using techniques known by those of skill in the art, detect a read failure, or detect any other type of failure that may require data recovery after the failure.

Figure 8:
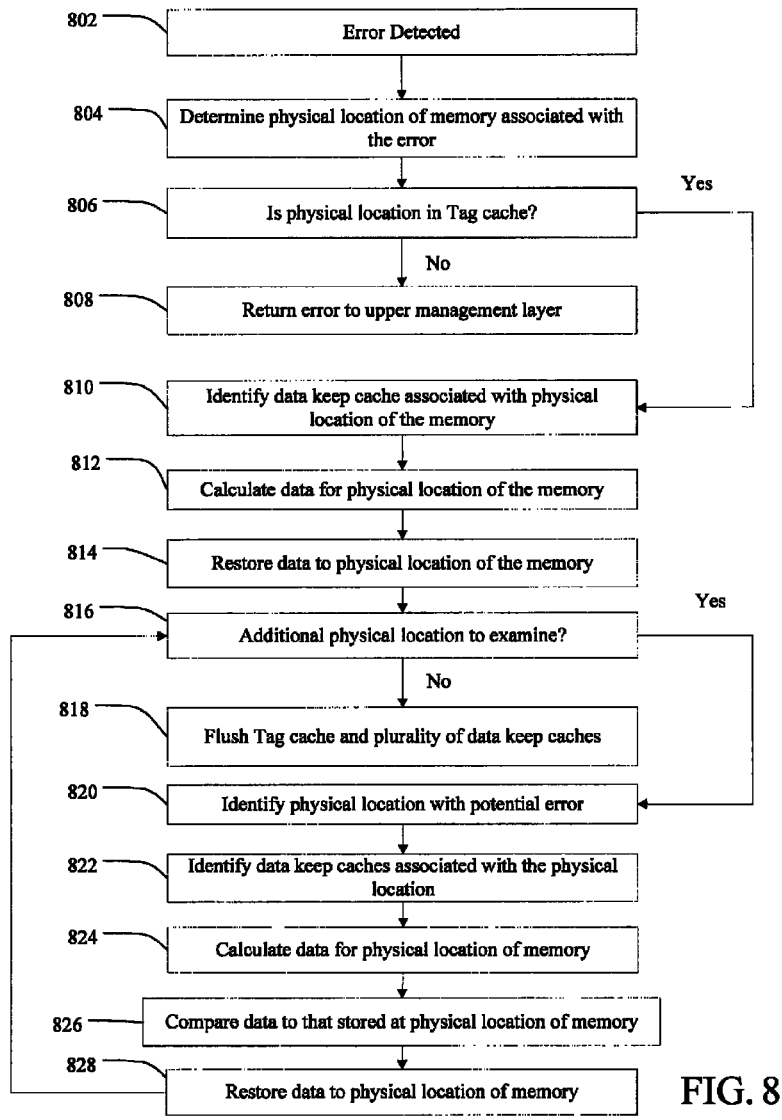
FIG. 8 is a flow chart of one method for performing data recovery after a controller detects a failure in the memory system.

FIG. 8 is a flow chart of one method for performing data recovery after a controller detects a failure in the memory system. The method begins at step 802 with the controller determining that a failure occurred during a data write. At step 804, the controller determines a physical location of the memory associated with the data write, and at step 806, the controller determines whether the physical location of the memory associated with the data write is present in the Tag cache.

If the controller determines at step 806 that the physical location of the memory associated with the data write is not present in the Tag cache, at step 808, the controller may return an error to an upper management layer of the memory system and/or host device.

However, if the controller determines at step 806 that the physical location of the memory associated with the data write is present in the Tag cache, at step 810, the controller identifies the data keep cache associated with the physical location of the memory.

At step 812, the controller calculates the data associated with the physical location based on the XOR sum stored in the identified data keep cache that is associated with the physical location of the memory that is associated with the data write. In one implementation, the controller calculates the data associated with the physical location by beginning with the XOR sum and un-XORing the data of each physical location of the memory stored in the Tag cache that is also associated with the identified data keep cache. At step 814, the controller then restores the data to the physical location of the memory where the originally detected failure occurred.

At step 816, the controller determines whether any additional physical locations of the memory should be examined based on the physical location of the memory where the originally detected failure occurred. Those of skill in the art will appreciate that a failure at a physical location of the memory may disturb other physical locations of the memory when the two physical locations of memory share a wordline or the two physical location of memory share adjacent wordlines, for example.

If the controller determines at step 816 that no additional locations of memory should be examined, at step 818, the controller flushes the Tag cache and the plurality of data keep caches. One process for flushing the Tag cache and the plurality of data keep caches is explained in more detail below in conjunction with FIG. 9.

However, if the controller determines at step 816 that additional locations of the memory should be examined, at step 820, the controller determines a second physical location of the memory that may have a potential error based on the determined failure at the original physical location of the memory. At step 822, the controller identifies a data keep cache associated with the second physical location.

At step 824, the controller calculates data associated with the second physical location based on the XOR sum stored in the identified data keep cache that is associated with the second physical location of the memory. In one implementation, the controller calculates the data associated with the second physical location by beginning with the XOR sum and un-XORing the data of each physical location of the memory stored in the Tag cache that is also associated with the identified data keep.

At step 826, the controller may compare the calculated data associated with the second physical location to the actual data stored at the second physical location to determine whether the data that is stored at the second physical location has been disturbed. At step 828, the controller restores the data stored at the second physical location of the memory when the controller determines that the data stored at the second physical cal location of the memory has been disturbed.

It will be appreciated that the process may then loop to step 816 and that the controller will repeat the above-described steps until the controller determines that no additional physical locations of the memory should be examined. After the data recovery is complete, the controller flushes the Tag cache and the plurality of data keep caches at step 818.

As discussed above at step 710 and step 818, a controller may flush a Tag cache and a plurality of data keep caches prior to writing a physical location associated with a data write to a Tag cache that is full and after recovering data subsequent to detecting a failure. In addition to these instances, a controller may also flush a Tag cache and a plurality of data keep caches when the controller erases a memory block and the controller determines that a physical location of the memory associated with the memory block is present in the Tag cache.

Figure 9:
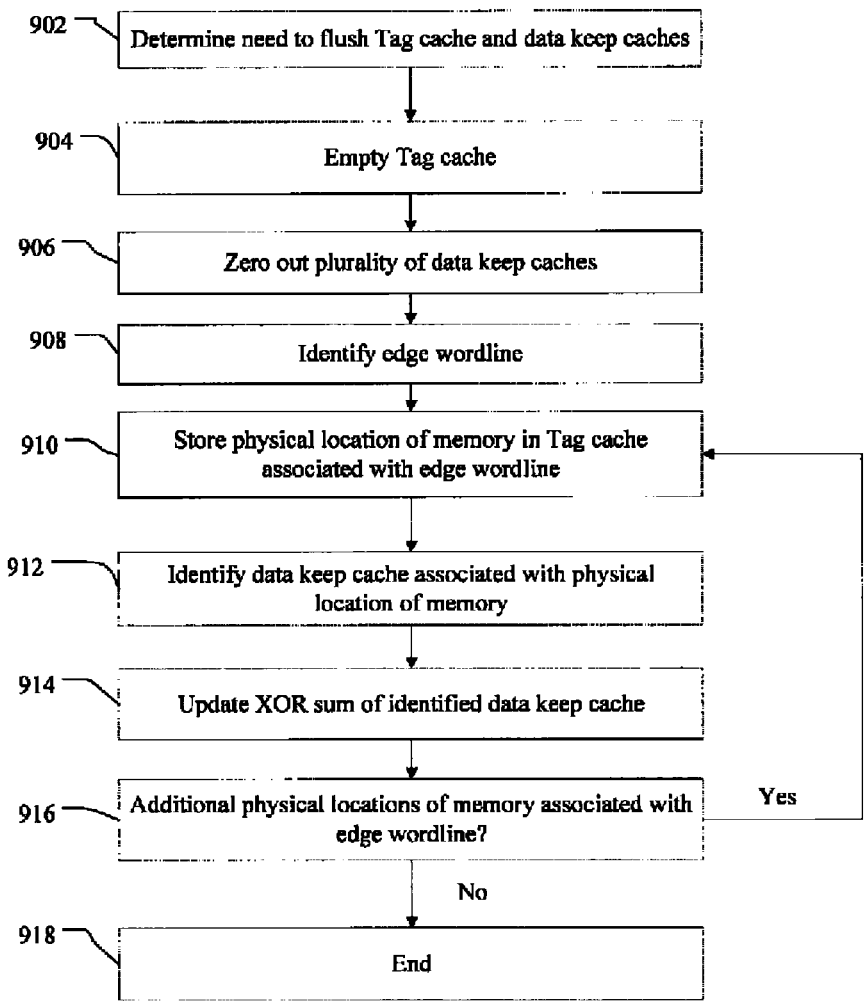
FIG. 9 is a flow chart of one method for flushing a Tag cache and a plurality of data keep caches.

FIG. 9 is a flow chart of one method for flushing a Tag cache and a plurality of data keep caches. At step 902, the controller determines a need to flush the Tag cache and the plurality of data keep caches. As noted above, the controller may determine a need to flush the Tag cache and the plurality of data keep caches, for example, before writing a physical location of a memory to a Tag cache that is full, after completing data recovery, or when a memory block is erased or compacted and the controller determines that a physical location of the memory associated with the memory block is stored in the Tag cache.

At step 904, the controller may flush the Tag cache by erasing all the values in the Tag cache, and at step 906, the controller may flush the plurality of data keep caches by resetting all the XOR sums stored in the data keep caches.

In some implementations, after flushing the Tag cache and the plurality of data keep caches, the controller may identify an edge wordline associated with an open memory block of the memory at step 908. For every open block, an edge wordline is a wordline of a memory that is associated with the last physical location of the memory that the controller has written data to.

It will be appreciated that data stored at a physical locations of the memory associated with the edge wordline may still be vulnerable to failures at the time of flushing the Tag cache and the plurality of data keep caches. It is for this reason that the controller stores physical locations of the memory associated with the edge wordline back into the Tag cache and updates the relevant XOR sums stored in the data keep caches as described below.

At step 910, the controller stores a physical location of the memory that is associated with the identified edge wordline in the Tag cache. At step 912, the controller identifies a data keep cache associated with the physical location of the memory stored in the Tag cache at step 910, and at step 914, the controller updates the XOR sum stored in the data keep cache based on the data stored at the physical location of the memory stored in the Tag cache at step 910.

At step 916, the controller determines whether there are additional physical locations of the memory associated with the edge wordline that may be vulnerable to failures that are not stored in the Tag cache. If the controller determines at step 916 that additional physical locations of the memory associated with the edge wordline exist that may be vulnerable to failures and are not stored in the Tag cache, the method loops to step 910 and the above-described process is repeated. However, if the controller determines at step 916 that the Tag cache includes all the physical locations of the memory associated with the edge wordline exist that may be vulnerable to failures, the process ends at step 918.

In some implementations the controller may perform the operations described above in conjunction with FIGS. 7-9 throughout a life of the memory system. However, in other implementations, the controller may disable one or more of the Tag cache and the plurality of data keep caches in order to increase performance of the memory system. Typically, the controller will disable one or more of the Tag cache and the plurality of data keep caches when a factor indicates to the controller that a probability of a new failure occurring in the memory is low.

For example, a controller may monitor a number of data writes to a memory as a whole or monitor a number of data writes to a specific physical location of a memory. When the number of monitored data writes exceeds a threshold, the controller may disable one or more of the Tag cache and the plurality of data keep caches.

FIGS. 1-9 illustrate systems and methods for performing defect detection and data recovery in a memory system. As explained above, a controller may utilize a system cache, such as a Tag cache, and a plurality of data keep caches to store information as the controller performs data write operations. When an error is detected, the controller may reconstruct and restore data to the physical location of the memory associated with the memory. Additionally, the controller may test other physical locations of the memory for potential errors based on the physical location of the detected error. Because the memory device utilizes techniques that are able to detect defects in a memory and perform error correction at a system level, manufactures may refrain from performing harsh tests on the memory system that may reduce the overall yield of the memory.

It is intended that the foregoing detailed description be regarded as illustrative rather than limiting, and that it be understood that it is the following claims, including all equivalents, that are intended to define the spirit and scope of this invention.

The invention claimed is:

1. A method for performing defect detection and data recovery within a memory system, the method comprising:
   in a controller of a memory system coupled to a host device:
   receiving a command to write data in a memory of the memory system;
   determining a physical location of the memory that is associated with the data write;
   writing data associated with the data write to the physical location of the memory;
   determining whether a Flash Management Unit Tag cache ("Tag cache") is full;
   in response to determining that the Tag case is not full, storing the physical location of the memory that is associated with the data write in the Tag cache;
   in response to determining that the Tag cache is full:
   flushing the Tag cache and a plurality of data keep caches;
   after flushing the Tag cache and the plurality of data keep caches, storing the physical location of the memory that is associated with the data write in the Tag cache;
   identifying an edge wordline associated with an open memory block of the memory;
   storing a physical location of the memory that is associated with the edge wordline in the Tag cache; and
   updating, based on data stored at the physical location of the memory that is associated with the edge wordline, an XOR sum stored in a data keep cache that is associated with the physical location of the memory that is associated with the edge wordline;

identifying a data keep cache of the plurality of data keep caches that is associated with the data write based on the physical location of the memory that is associated with the data write;

updating an XOR sum stored in the identified data keep cache based on the data of the data write and the XOR sum that is stored in the identified data keep cache; and storing the updated XOR sum in the identified data keep cache.

2. The method of claim 1, wherein the Tag cache comprises a first-in-first-out data cache.

3. The method of claim 1, wherein the plurality of data keep caches comprises:

a first data keep cache associated with upper pages and even numbered word lines of a die of the memory;

a second data keep cache associated with upper pages and odd numbered word lines of the die of the memory;

a third data keep cache associated with lower pages and even numbered word liens of the die of the memory; and a fourth data keep cache associated with lower pages and odd numbered word lines of the die of the memory.

4. The method of claim 1, further comprising:

determining that a failure occurred during the data write;

determining that the physical location of the memory associated with the data write is stored in the Tag cache;

calculating the data associated with the data write based on the XOR sum that is stored in the data keep cache associated with the physical location of the memory that is associated with the data write; and restoring the data associated with the data write to the physical location of the memory.

5. The method of claim 4, further comprising:

determining a second physical location of the memory that may have a potential error based on the determined failure at the physical location of the memory;

identifying a second data keep cache of the plurality of data keep caches that is associated with the second physical location of the memory;

calculating data associated with the second physical location of the memory based on an XOR sum that is stored in the second data keep cache;

comparing the calculated data associated with the second physical location of the memory to data that is stored at the second physical location of the memory to determine whether the data that is stored at the second physical location of the memory has been disturbed; and restoring the data stored at the second physical location of the memory in response to determining that the data stored at the second physical location of the memory has been disturbed.

6. The method of claim 1, further comprising:

determining a need to erase data stored at the physical location of the memory;

determining whether the physical location of the memory is stored in the Tag cache;

flushing the Tag cache and the plurality of data keep caches in response to determining that the physical location of the memory is stored in the Tag cache; and erasing data that is stored at the physical location of the memory.

7. The method of claim 1, further comprising:

determining whether a number of data writes to the physical location of the memory exceeds a threshold; and disabling the plurality of data keep caches in response to determining that the number of data writes to the physical location of the memory exceeds the threshold.

8. The method of claim 1, further comprising:

dynamically adjusting a size of the Tag cache or one or more data keep cache of the plurality of data keep caches based on a number of open data block in the storage device.

9. A memory system coupled with a host device, the memory system comprising:

a non-volatile memory; and a processor in communication with the non-volatile memory and configured to perform defect detection and data recovery within the memory system, the processor configured to:

receive a command to write data in the non-volatile memory;

determine a physical location of the non-volatile memory that is associated with the data write;

write data associated with the data write to the physical location of the non-volatile memory;

determine whether a Flash Management Unit Tag cache ("Tag cache") is full;

in response to a determination that the Tag case is not full, store the physical location of the non-volatile memory that is associated with the data write in the Tag cache;

in response to a determination that the Tag cache is full:

flush the Tag cache and a plurality of data keep caches;

after flushing the Tag cache and the plurality of data keep caches, store the physical location of the non-volatile memory that is associated with the data write in the Tag cache;

identify an edge wordline associated with an open memory block of the non-volatile memory;

store a physical location of the non-volatile memory that is associated with the edge wordline in the Tag cache; and update, based on data stored at the physical location of the non-volatile memory that is associated with the edge wordline, an XOR sum stored in a data keep cache that is associated with the physical location of the memory that is associated with the edge wordline;

identify a data keep cache of the plurality of data keep caches that is associated with the data write based on the physical location of the non-volatile memory that is associated with the data write;

update an XOR sum stored in the identified data keep cache based on the data of the data write and the XOR sum that is stored in the identified data keep cache; and store the updated XOR sum in the identified data keep cache.

10. The memory system of claim 9, wherein the Tag cache comprises a first-in-first-out data cache.

11. The memory system of claim 9, wherein the processor is further configured to:

determine that a failure occurred during the data write;

determine that the physical location of the non-volatile memory that is associated with the data write is stored in the Tag cache;

calculate the data associated with the data write based on the second XOR sum that is stored in the data keep cache associated with the physical location of the memory that is associated with the data write; and restore the data associated with the data write to the physical location of the non-volatile memory.

12. The memory system of claim 11, wherein the processor is further configured to:

determine a second physical location of the non-volatile memory that may have a potential error based on the determined failure at the physical location of the non-volatile memory;

identify a second data keep cache of the plurality of data keep caches that is associated with the second physical location of the non-volatile memory;

calculate data associated with the second physical location of the non-volatile memory based on an XOR sum that is stored in the second data keep cache;

compare the calculated data associated with the second physical location of the non-volatile memory to data that is stored at the second physical location of the non-volatile memory to determine whether the data that is stored at the second physical location of the non-volatile memory has been disturbed; and restore the data stored at the second physical location of the non-volatile memory in response to determining that the data that is stored at the second physical location of the non-volatile memory has been disturbed.

13. The memory system of claim 9, wherein the processor is further configured to:

determine a need to erase data that is stored at the physical location of the non-volatile memory;

determine whether the physical location of the non-volatile memory is stored in the Tag cache;

flush the Tag cache and the plurality of data keep caches in response to determining that the physical location of the non-volatile memory is stored in the Tag cache; and erase data that is stored at the physical location of the non-volatile memory.

14. The memory system of claim 9, wherein the processor is further configured to:

determine whether a number of data writes to the physical location of the non-volatile memory exceeds a threshold; and disabling the plurality of data keep caches in response determining that the number of data writes to the physical location of the non-volatile memory exceeds the threshold.

15. The memory system of claim 9, wherein the processor is further configured to:

dynamically adjust a size of the Tag cache or one or more data keep cache of the plurality of data keep caches based on a number of open data block in the storage device.

* * * * *